United States Patent
Chia et al.

(10) Patent No.: US 11,031,273 B2
(45) Date of Patent: Jun. 8, 2021

(54) PHYSICAL VAPOR DEPOSITION (PVD) ELECTROSTATIC CHUCK WITH IMPROVED THERMAL COUPLING FOR TEMPERATURE SENSITIVE PROCESSES

(71) Applicant: APPLIED MATERIALS, INC., Santa Clara, CA (US)

(72) Inventors: Bonnie T Chia, Sunnyvale, CA (US); Ross Marshall, Campbell, CA (US); Tomoharu Matsushita, Chiba (JP); Cheng-Hsiung Tsai, Cupertino, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 166 days.

(21) Appl. No.: 16/213,816

(22) Filed: Dec. 7, 2018

(65) Prior Publication Data
US 2020/0185247 A1   Jun. 11, 2020

(51) Int. Cl.
| | |
|---|---|
| H01L 21/683 | (2006.01) |
| H01L 21/67 | (2006.01) |
| F24F 3/00 | (2006.01) |
| H02N 13/00 | (2006.01) |

(52) U.S. Cl.
CPC .......... *H01L 21/6833* (2013.01); *H01L 21/67* (2013.01); *H01L 21/67213* (2013.01); *H01L 21/683* (2013.01); *F24F 3/00* (2013.01); *H02N 13/00* (2013.01)

(58) Field of Classification Search
USPC ....................................................... 361/234
See application file for complete search history.

(56) References Cited

U.S. PATENT DOCUMENTS

| | | | |
|---|---|---|---|
| 6,108,189 A * | 8/2000 | Weldon | C23C 16/4586 |
| | | | 279/128 |
| 6,639,783 B1 | 10/2003 | Shamouilian et al. | |
| 8,390,980 B2 | 3/2013 | Sansoni et al. | |
| 2003/0029610 A1* | 2/2003 | Moslehi | H01L 21/67103 |
| | | | 165/206 |
| 2008/0037194 A1 | 2/2008 | Kamitani et al. | |
| 2010/0039747 A1 | 2/2010 | Sansoni et al. | |
| 2016/0276198 A1* | 9/2016 | Anada | H01L 21/6833 |

FOREIGN PATENT DOCUMENTS

| | | |
|---|---|---|
| JP | 2000-332091 A | 11/2000 |
| JP | 2001/118915 A | 4/2001 |
| JP | 2005-136350 A | 5/2005 |

\* cited by examiner

*Primary Examiner* — Danny Nguyen
(74) *Attorney, Agent, or Firm* — Moser Taboada

(57) ABSTRACT

Embodiments of an electrostatic chuck are provided herein. In some embodiments an electrostatic chuck includes an electrode, a dielectric body having a disk shape and covering the electrode, the dielectric body including a central region and a peripheral region, and the dielectric body including a lower surface having a central opening and an upper surface having a first opening in the central region and a plurality of second openings in the peripheral region, wherein the upper surface includes a plurality of protrusions and a diameter of each of the plurality of second openings is greater than 25.0 mils, and gas distribution channels that extend from the lower surface to the upper surface to define a plenum within the dielectric body.

17 Claims, 4 Drawing Sheets

PHYSICAL VAPOR DEPOSITION (PVD) ELECTROSTATIC CHUCK WITH IMPROVED THERMAL COUPLING FOR TEMPERATURE SENSITIVE PROCESSES

FIELD

Embodiments of the present disclosure generally relate to substrate processing equipment, and more specifically to substrate supports used in processing equipment.

BACKGROUND

Deposition chambers, such as a physical vapor deposition (PVD) chambers, are often used to form layers of thin films on substrates. The deposition process requires a high vacuum pressure. An electrostatic chuck is often used to electrostatically retain a substrate on a substrate support during the deposition process. An electrostatic chuck typically comprises a dielectric body having one or more electrodes disposed therein. The electrostatic chuck may have one or more heaters embedded to provide thermal coupling to the substrate when the substrate is placed on the electrostatic chuck.

However, the inventors have observed that certain deposition processes are highly temperature sensitive. Accordingly, the inventors have provided improved apparatus for depositing materials via physical vapor deposition with improved thermal coupling between the electrostatic chuck and the substrate.

SUMMARY

Embodiments of an electrostatic chuck are provided herein. In some embodiments an electrostatic chuck includes an electrode, a dielectric body having a disk shape and covering the electrode, the dielectric body including a central region and a peripheral region, and the dielectric body including a lower surface having a central opening and an upper surface having a first opening in the central region and a plurality of second openings in the peripheral region, wherein the upper surface includes a plurality of protrusions and a diameter of each of the plurality of second openings is greater than 25.0 mils, gas distribution channels that extend from the lower surface to the upper surface to define a plenum within the dielectric body, the gas distribution channels including a first channel that extends from the central opening to the first opening, a plurality of radial channels that extend from the first channel to an annular channel disposed in the peripheral region, and a plurality of second channels that extend from the annular channel to the plurality of second openings; and a heater disposed in the dielectric body.

In some embodiments, a substrate support includes a hollow shaft and a pedestal, the pedestal including a housing coupled to the hollow shaft, a dielectric body covering an electrode, the dielectric body coupled to the housing and including an upper surface having a first opening in a central region of the dielectric body and a plurality of second openings in a peripheral region of the dielectric body and a lower surface having a central opening, a plenum including a first channel that extends from the central opening to the first opening, a plurality of radial channels that extend from the first channel to an annular channel disposed in the peripheral region, and a plurality of second channels that extend from the annular channel to the plurality of second openings, wherein a length of the plurality of second channels from the annular channel to the plurality of second openings is greater than 120.0 mils, and one or more heating elements disposed in the dielectric body.

In some embodiments, a physical vapor deposition (PVD) process chamber includes a chamber body, a substrate support disposed within the chamber body and having a pedestal coupled to a hollow shaft, the pedestal having a dielectric body covering an electrode, the dielectric body including an upper surface and a lower surface, the upper surface configured to receive a substrate and the upper surface having a first opening in a central region of the dielectric body and a plurality of second openings in a peripheral region of the dielectric body and the lower surface having a central opening, wherein a diameter of each of the plurality of second openings is greater than 25.0 mils, a heater disposed in the dielectric body, a gas conduit extending from a gas supply disposed outside of the chamber body to the central opening, and gas distribution channels extending from the central opening to the plurality of second openings, the gas distribution channels in fluid communication with the gas conduit.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
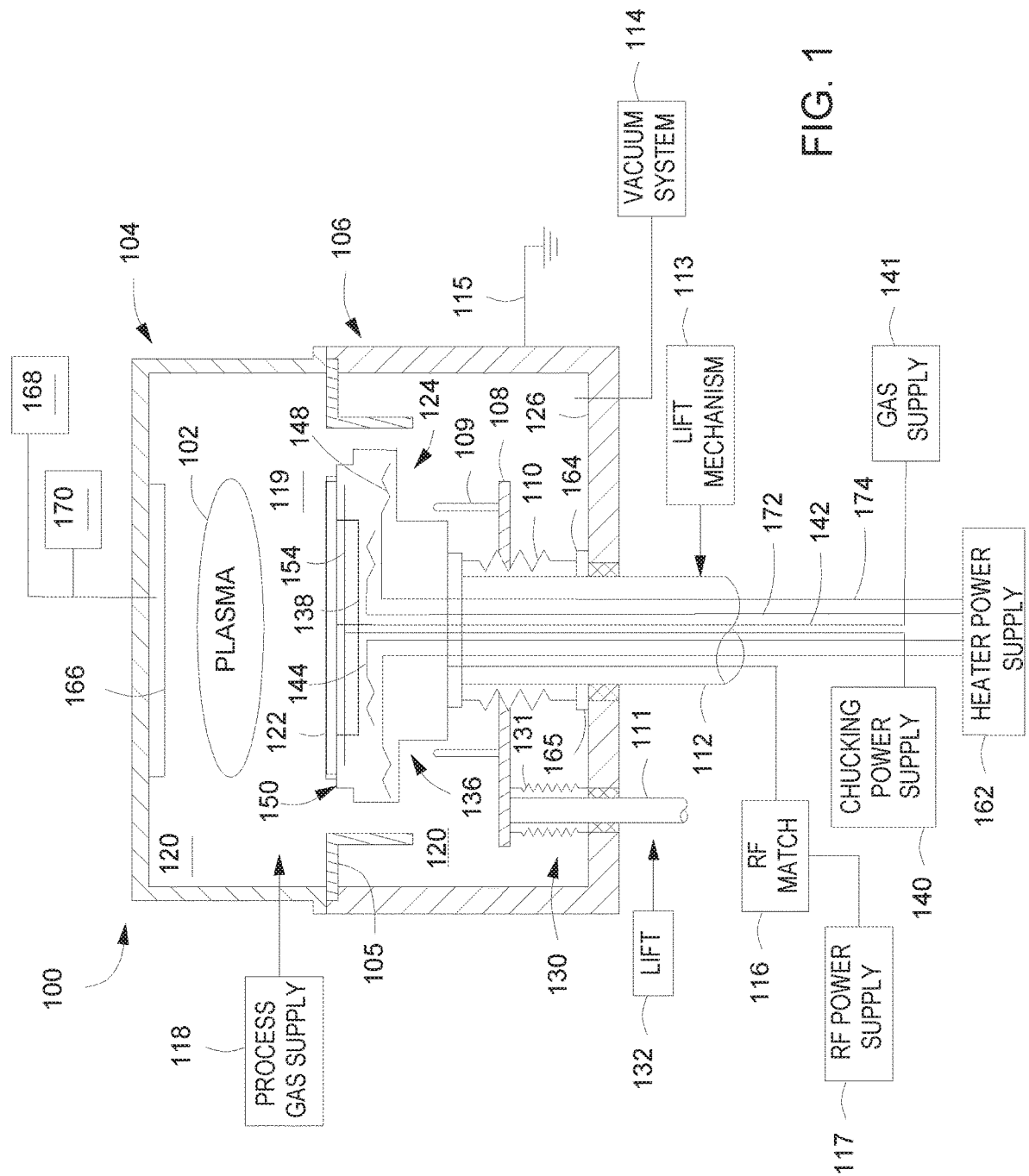
FIG. 1 depicts a schematic side view of a process chamber having an electrostatic chuck in accordance with at least some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of an electrostatic chuck (ESC) having internal gas channels to improve thermal coupling between the ESC and the substrate are provided herein. The internal gas channels may extend from a single inlet disposed on a lower surface of the ESC to multiple outlets disposed on an upper surface of the ESC. The single inlet is coupled to a backside gas supply containing, for example, argon (Ar), helium (He), or the like. The backside gas is configured to flow through the internal gas channels to advantageously improve thermal coupling of the ESC and the substrate and to provide improved temperature uniformity across the substrate as the substrate is heated. The internal gas channels extending from a single inlet to multiple outlets on an upper surface of the ESC provides for an easy connection to a single backside gas supply line as compared to multiple backside gas supply lines coupled to the multiple outlets on an upper surface of the ESC.

FIG. 1 is a schematic cross-sectional view of process chamber (e.g., a plasma processing chamber) in accordance with some embodiments of the present disclosure. In some embodiments, the plasma processing chamber is a physical vapor deposition (PVD) processing chamber. However, other types of processing chambers configured for different processes can also use or be modified for use with embodiments of the electrostatic chuck described herein.

The chamber 100 is a vacuum chamber which is suitably adapted to maintain sub-atmospheric pressures within a chamber interior volume 120 during substrate processing. The chamber 100 includes a chamber body 106 covered by a lid 104 which encloses a processing volume 119 located in the upper half of chamber interior volume 120. The chamber 100 may also include one or more shields 105 circumscribing various chamber components to prevent unwanted reaction between such components and ionized process material. The chamber body 106 and lid 104 may be made of metal, such as aluminum. The chamber body 106 may be grounded via a coupling to ground 115.

A substrate support 124 is disposed within the chamber interior volume 120 to support and retain a substrate 122, such as a semiconductor wafer, for example, or other such substrate as may be electrostatically retained. The substrate support 124 may generally comprise a pedestal 136 having an electrostatic chuck 150 (described in more detail below with respect to FIGS. 2-4) and a hollow support shaft 112 for supporting the electrostatic chuck 150. The electrostatic chuck 150 comprises a dielectric body having one or more electrodes 154 disposed therein. The hollow support shaft 112 provides a conduit to provide, for example, backside gases, process gases, fluids, coolants, power, or the like, to the electrostatic chuck 150.

In some embodiments, the hollow support shaft 112 is coupled to a lift mechanism 113, such as an actuator or motor, which provides vertical movement of the electrostatic chuck 150 between an upper, processing position (as shown in FIG. 1) and a lower, transfer position (not shown). A bellows assembly 110 is disposed about the hollow support shaft 112 and is coupled between the electrostatic chuck 150 and a bottom surface 126 of chamber 100 to provide a flexible seal that allows vertical motion of the electrostatic chuck 150 while preventing loss of vacuum from within the chamber 100. The bellows assembly 110 also includes a lower bellows flange 164 in contact with an o-ring 165 or other suitable sealing element which contacts the bottom surface 126 to help prevent loss of chamber vacuum.

The hollow support shaft 112 provides a conduit for coupling a backside gas supply 141, a chucking power supply 140, and RF sources (e.g., RF plasma power supply 170 and RF bias power supply 117) to the electrostatic chuck 150. In some embodiments, RF energy supplied by the RF plasma power supply 170 may have a frequency of about 40 MHz or greater. The backside gas supply 141 is disposed outside of the chamber body 106 and supplies heat transfer gas to the electrostatic chuck 150. In some embodiments, RF plasma power supply 170 and RF bias power supply 117 are coupled to the electrostatic chuck via respective RF match networks (only RF match network 116 shown). In some embodiments, the substrate support may alternatively include AC, DC, or RF bias power.

A substrate lift 130 can include lift pins 109 mounted on a platform 108 connected to a shaft 111 which is coupled to a second lift mechanism 132 for raising and lowering the substrate lift 130 so that the substrate 122 may be placed on or removed from the electrostatic chuck 150. The electrostatic chuck 150 includes thru-holes to receive the lift pins 109. A bellows assembly 131 is coupled between the substrate lift 130 and bottom surface 126 to provide a flexible seal which maintains the chamber vacuum during vertical motion of the substrate lift 130.

The electrostatic chuck 150 includes gas distribution channels 138 extending from a lower surface of the electrostatic chuck 150 to various openings in an upper surface of the electrostatic chuck 150. The gas distribution channels 138 are in fluid communication with the backside gas supply 141 via gas conduit 142. The gas distribution channels 138 extend below the electrodes 154. The pedestal 136 includes one or more heaters. For example, in some embodiments, the pedestal 136 includes an inner heater 144 having one or more resistive heating elements 308 configured to provide heat to an inner portion of the pedestal 136. In some embodiments, the pedestal 136 may further include an outer heater 148 disposed in a peripheral region of the pedestal 136 and configured to provide heat to an outer portion of the pedestal 136. The outer heater 148 includes one or more resistive heating elements 310. The hollow support shaft 112 further includes a power source (e.g., AC power source 162) coupled to the inner heater 144 via first leads 172 to power the heating elements of the inner heater 144. The AC power source 162 may also power the heating elements of the outer heater 148 via second leads 174. Alternatively, the second leads 174 may be coupled to a power source independent of the power source coupled to the inner heater 144. In some embodiments, the inner heater 144 is disposed in a central region of the pedestal 136. In some embodiments, the outer heater 148 is disposed in a peripheral region of the pedestal 136. A power applied to the inner heater 144 by a power source may be different than a power applied to the outer heater 148. As such, in some embodiments, the substrate support 124 includes dual zone temperature control.

The chamber 100 is coupled to and in fluid communication with a vacuum system 114 which includes a throttle valve (not shown) and vacuum pump (not shown) which are used to exhaust the chamber 100. The pressure inside the chamber 100 may be regulated by adjusting the throttle valve and/or vacuum pump. The chamber 100 is also coupled to and in fluid communication with a process gas supply 118 which may supply one or more process gases to the chamber 100 for processing a substrate disposed therein.

In operation, for example, a plasma 102 may be created in the chamber interior volume 120 to perform one or more processes. The plasma 102 may be created by coupling power from a plasma power source (e.g., RF plasma power supply 170) to a process gas via one or more electrodes 154 near or within the chamber interior volume 120 to ignite the process gas and creating the plasma 102. In some embodiments, a bias power may also be provided from a bias power supply (e.g., RF bias power supply 117) to one or more electrodes 154 within the electrostatic chuck 150 via a capacitively coupled bias plate (described below) to attract ions from the plasma towards the substrate 122. The electrostatic chuck may have a particular thickness above the electrode. The thickness may be based on a specification that specifies an acceptable thickness range above the electrode. For Johnson Rahbek (J-R) type electrostatic chucks, the thickness may be about 200-300 microns. Alternatively, the specification may set forth an acceptable thickness of the electrostatic chuck.

In some embodiments, for example where the chamber 100 is a PVD chamber, a target 166 comprising a source material to be deposited on a substrate 122 may be disposed above the substrate and within the chamber interior volume 120. The target 166 may be supported by a grounded conductive portion of the chamber 100, for example an aluminum adapter through a dielectric isolator. In other embodiments, the chamber 100 may include a plurality of targets in a multi-cathode arrangement for depositing layers of different material using the same chamber.

A controllable DC power source 168 may be coupled to the chamber 100 to apply a negative voltage, or bias, to the target 166. The RF bias power supply 117 may be coupled to the substrate support 124 in order to induce a negative DC bias on the substrate 122. In addition, in some embodiments, a negative DC self-bias may form on the substrate 122 during processing. In some embodiments, an RF plasma power supply 170 may also be coupled to the chamber 100 to apply RF power to the target 166 to facilitate control of the radial distribution of a deposition rate on substrate 122. In operation, ions in the plasma 102 created in the chamber 100 react with the source material from the target 166. The reaction causes the target 166 to eject atoms of the source material, which are then directed towards the substrate 122, thus depositing material.

Figure 2:
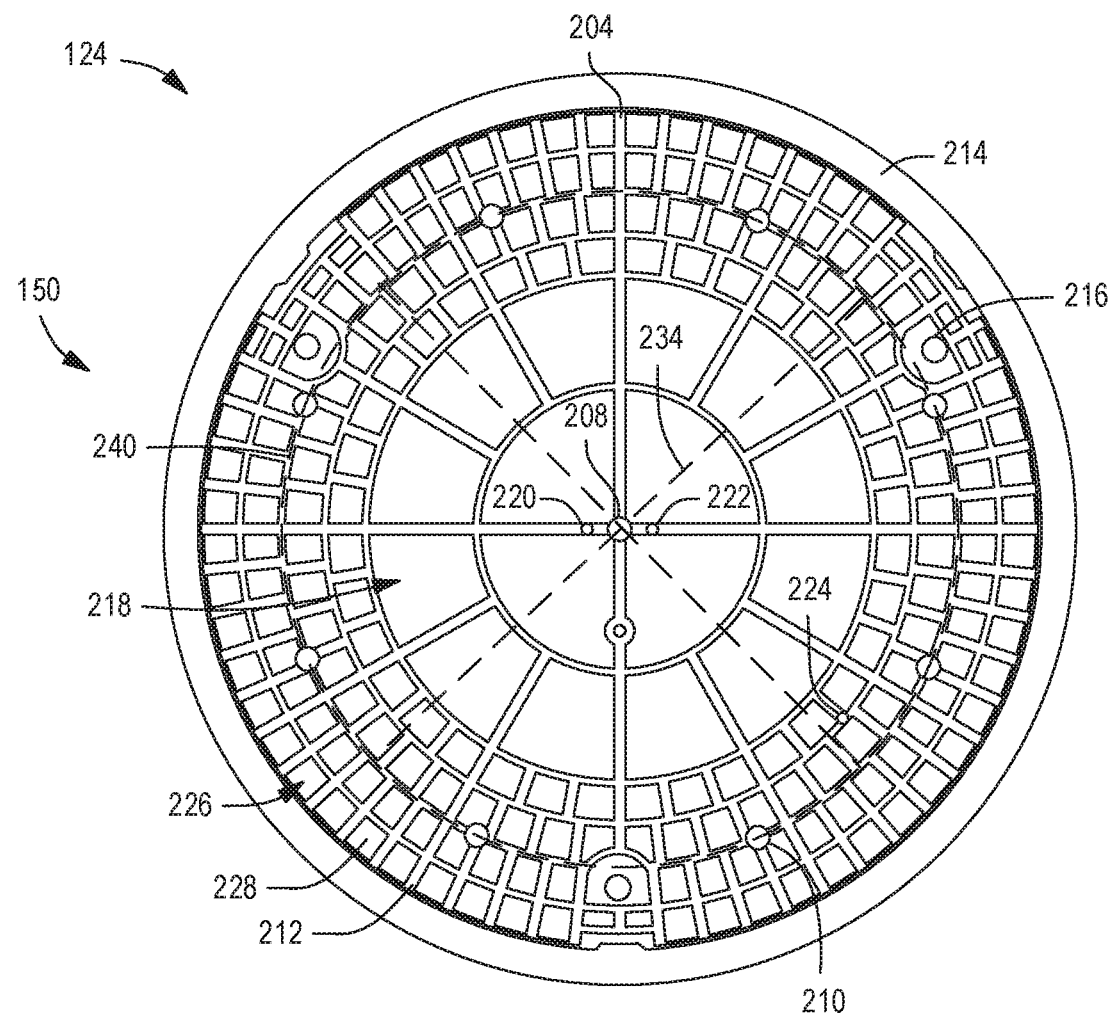
FIG. 2 depicts a top view of a substrate support in accordance with at least some embodiments of the present disclosure.

FIG. 2 depicts a top view of an electrostatic chuck in accordance with at least some embodiments of the present disclosure. The electrostatic chuck includes an upper surface 204. One or more through holes 216 extend through the electrostatic chuck 150 to accommodate lift pins 109. As shown in FIG. 2, the electrostatic chuck 150 includes three through holes 216 disposed in a peripheral region of the electrostatic chuck. The upper surface includes a first opening 208 disposed in a central region of the electrostatic chuck 150. In some embodiments, an upper peripheral portion of the electrostatic chuck 150 includes a notch that defines a lower ledge 214 that is parallel to the upper surface 204.

The upper surface includes a plurality of second openings 210 disposed in the peripheral region of the electrostatic chuck 150. As shown in FIG. 2, the plurality of second openings 210 includes eight second openings arranged at regular intervals (e.g. equidistant from each other) about the first opening 208. In some embodiments, the plurality of second openings 210 are arranged in a single annular pattern about the first opening 208 (e.g., along a common diameter). In some embodiments, the plurality of second openings 210 are disposed about 200.0 mm to about 280.0 mm from the first opening 208. In some embodiments the plurality of second openings are disposed about 220.0 mm to about 260.0 mm from the first opening 208. In some embodiments, the plurality of second openings 210 are arranged in multiple annular patterns about the first opening 208 (e.g., arrange along multiple different diameters). Although FIG. 2 shows eight second openings, the plurality of second openings 210 may consist of more openings or less openings. For example, in some embodiments, the plurality of second openings 210 may include four openings. In some embodiments, the plurality of second openings 210 may include sixteen openings.

The upper surface 204 includes a plurality of protrusions 206 that extend from the upper surface 204. The plurality of protrusions 206 define recesses 212 between the protrusions 206. The recesses 212 are configured to flow the backside gas across the upper surface 204 of the electrostatic chuck 150 while a substrate is disposed on a substrate receiving surface 228 to advantageously improve thermal coupling between the substrate 122 and the electrostatic chuck 150. The protrusions 206 may have various shapes and may be different sizes. In some embodiments, the size and shape of the protrusions 206 vary across the electrostatic chuck 150. The protrusions 206 (e.g., upper surfaces of the protrusions 206) together define the substrate receiving surface 228. The depth, width, and density of the protrusions 206 are designed to enhance uniform gas distribution across the electrostatic chuck 150. In some embodiments, a first set of protrusions 226 in a central region of the electrostatic chuck 150 have a greater surface area, or density, than a second set of protrusions 218 in a peripheral region of the electrostatic chuck 150 to advantageously provide improved thermal coupling at the peripheral region of the electrostatic chuck 150.

The electrostatic chuck 150 includes a first thermocouple opening 220 in the central region of the electrostatic chuck 150. In some embodiments, the electrostatic chuck 150 includes a second thermocouple opening 222 in the central region of the electrostatic chuck 150. In some embodiments, the first thermocouple opening 220 and the second thermocouple opening 222 are disposed near the first opening 208. In some embodiments, the first thermocouple opening 220 and the second thermocouple opening 222 are disposed opposite each other about the first opening 208. In some embodiments, the electrostatic chuck 150 includes a third thermocouple opening 224 at an interface between the central region and the peripheral region of the electrostatic chuck 150.

The first, second, and third thermocouple openings 220, 222, 224 can accommodate a thermocouple that may be embedded in the electrostatic chuck 150 and used to monitor the temperature of the electrostatic chuck 150. For example, a signal from a thermocouple may be used in a feedback loop to control power applied to the inner heater 144 and the outer heater 148 by the AC power source 162. Having both the first thermocouple opening 220 and the second thermocouple opening 222 in the central region advantageously provides redundant temperature monitoring and allows for a more accurate temperature measurement for the feedback loop. Having a third thermocouple opening 224 at or near the peripheral region provides for temperature monitoring at the peripheral region which is advantageous for a substrate support having multiple heaters.

Figure 3:
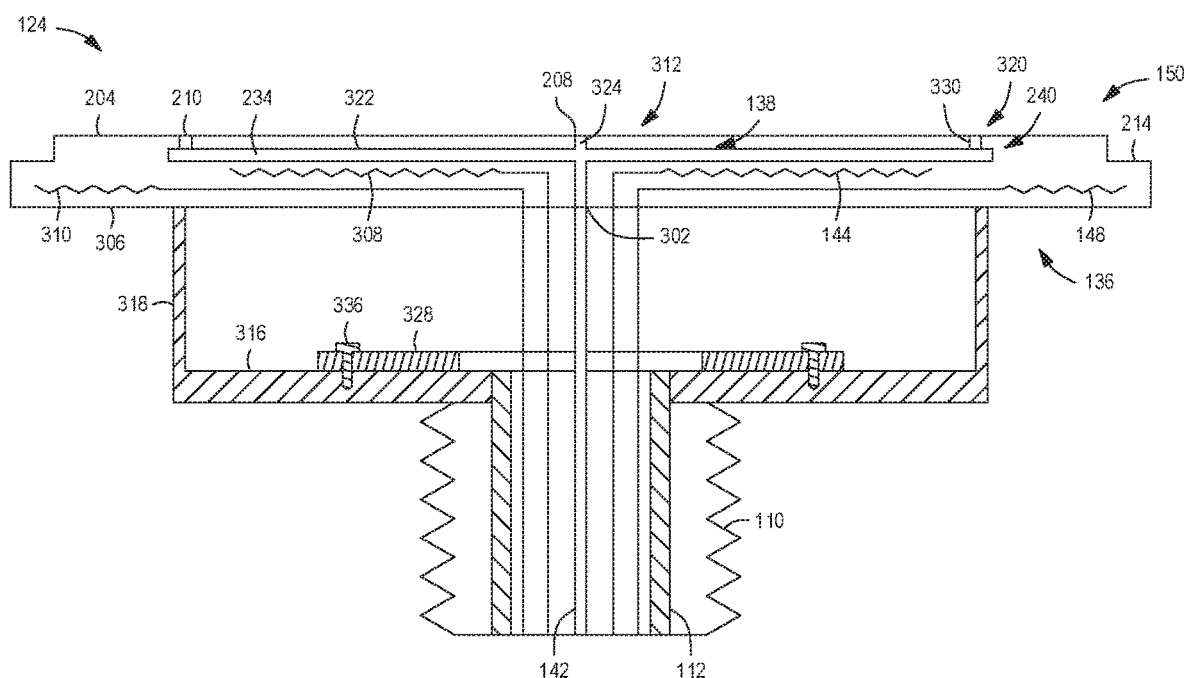
FIG. 3 depicts a schematic side view of the substrate support in accordance with at least some embodiments of the present disclosure.

FIG. 3 depicts a schematic side view of the substrate support. The substrate support 124 includes a pedestal 136 having a base 316 and sidewalls 318 extending upwards from the base 316. The base 316 and the sidewalls 318 form a housing of the pedestal 136. The electrostatic chuck 150 rests on the sidewalls 318. No hatching is shown in the schematic side view of the electrostatic chuck 150 in order to not obscure the details. The base 316 is coupled to the hollow support shaft 112. A cooling plate 328 is coupled to the base 316 via fasteners 336. The cooling plate 328 is configured to cool the electrostatic chuck 150 to advantageously reduce cooling time of the electrostatic chuck 150 prior to any maintenance performed to the chamber 100.

The electrostatic chuck 150 includes a central region 312 and a peripheral region 320. In some embodiments, the central region has a diameter of about 150.0 mm to about 210.0 mm. The peripheral region 320 extends from an outer edge of the central region to an outer edge of the electrostatic chuck 150. The electrostatic chuck 150 includes a lower surface 306 opposite the upper surface 204. The lower surface 306 includes a central opening 302 disposed in the central region 312. The first channel 324 extends from the central opening 302 of the lower surface 306 to the first opening 208 of the upper surface 204. The first channel 324 is fluidly coupled to gas conduit 142. Radial channels 234 extend from the first channel 324 to an annular channel 240 disposed in the peripheral region 320. A plurality of second channels 330 extend from the annular channel 240 to the plurality of second openings 210. In some embodiments, the first channel 324 has a diameter similar to the second channels 330. In some embodiments, the first channel 324 has a diameter greater than a diameter of the second channels 330. The radial channels 234 and the annular channel 240 are disposed below the electrodes 154. As such, the chucking force of the electrodes 154 is not affected by the depth of the gas distribution channels 138. In some embodiments, a length of the plurality of second channels 330 from the annular channel 240 to the plurality of second openings 210 is greater than 120.0 mils. In some embodiments, the length of the plurality of second channels 330 is about 160.0 mils to about 200.0 mils.

The gas distribution channels 138 include a plenum 322 defined by the first channel 324, the radial channels 234, the annular channel 240, and the plurality of second channels 330. The plurality of second channels 330 along with the first channel 324 advantageously uniformly distributes the backside gas across the upper surface 204 of the electrostatic chuck 150. The plurality of second openings 210 and the first opening 208 are large enough for improved gas conductance but small enough to inhibit gas ignition. In some embodiments, a diameter of each of the plurality of second openings 210 and the first opening 208 is greater than 25.0 mils so that backside gas may flow to the upper surface 204 at a suitable rate for improved gas conductance. In some embodiments, a diameter of each of the plurality of second openings is about 36.0 mm to about 42.0 mm.

Figure 4:
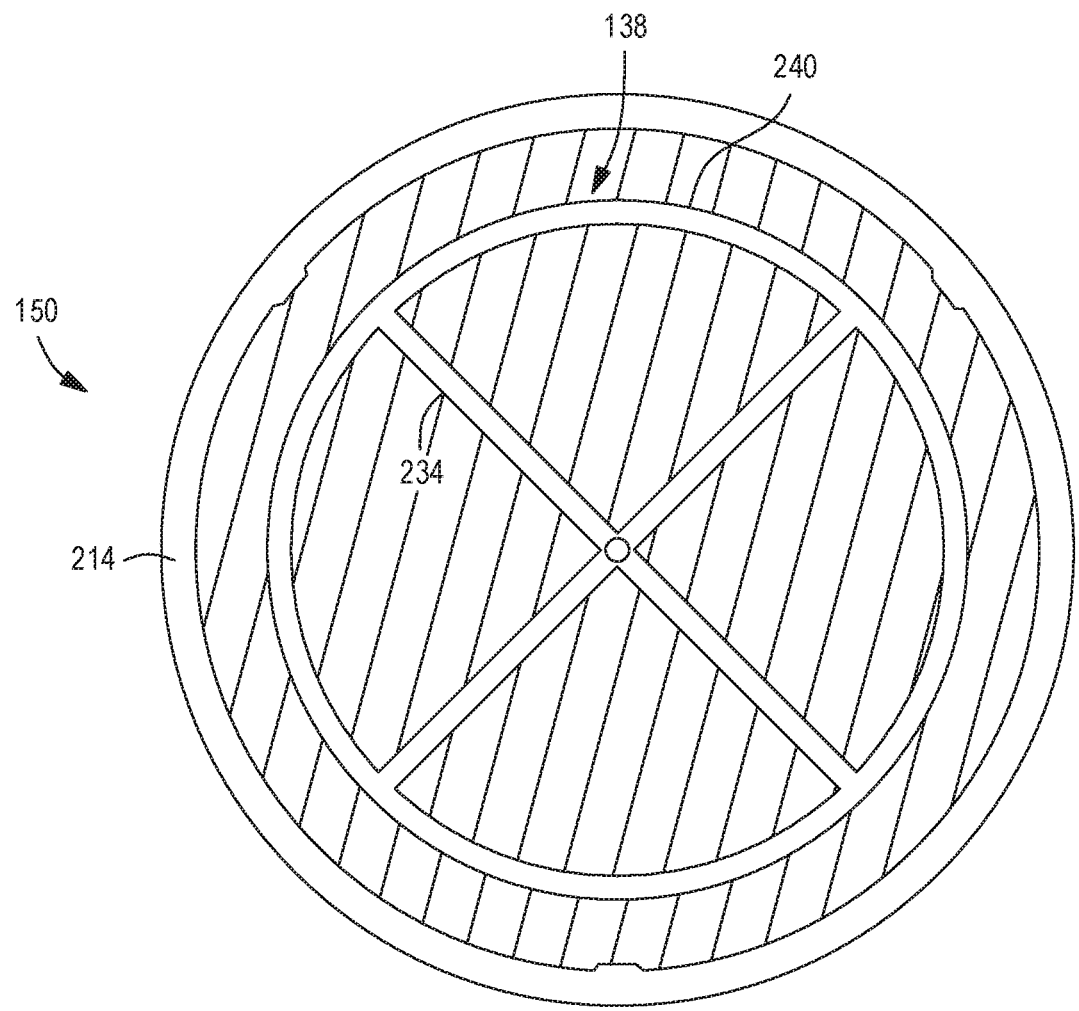
FIG. 4 depicts a cross-sectional top view of the electrostatic chuck of FIG. 2.

FIG. 4 depicts a cross-sectional top view of the electrostatic chuck of FIG. 2. As shown in FIG. 4, the gas distribution channels 138 include four radial channels 234 extending from the first channel 324 to the annular channel 240. Each one of the four radial channels 234 extend radially outwards at about ninety degrees from an adjacent radial channel 234. In some embodiments, the radial channels 234 couple to the annular channel 240 at locations corresponding with the second channels 330. In some embodiments, the radial channels 234 couple to the annular channel 240 at locations that do not correspond with the second channels 330. For example, in some embodiments, the electrostatic chuck 150 includes eight second channels 330 and four radial channels 234 wherein each of the radial channels 234 extend between adjacent second channels 330. In some embodiments, the radial channels 234 extend about halfway between adjacent second channels 330 so that a distance between each second channel 330 is equidistant from a nearest radial channel 234 so that the backside gas can more uniformly flow to all of the second channels 330. The annular channel 240 advantageously allows for the number of second channels 330 to be greater than a number of radial channels 234.

While the foregoing is directed to embodiments of the present disclosure, other and further embodiments of the disclosure may be devised without departing from the basic scope thereof.

The invention claimed is:

1. An electrostatic chuck, comprising:
 an electrode;
 a dielectric body having a disk shape and covering the electrode, the dielectric body including a central region and a peripheral region, and the dielectric body including a lower surface having a central opening and an upper surface having a first opening in the central region and a plurality of second openings in the peripheral region, wherein the upper surface includes a plurality of protrusions and a diameter of each of the plurality of second openings is greater than 25.0 mils;
 gas distribution channels that extend from the lower surface to the upper surface to define a plenum within the dielectric body, the gas distribution channels including a first channel that extends from the central opening to the first opening, a plurality of radial channels that extend from the first channel to an annular channel disposed in the peripheral region, and a plurality of second channels that extend from the annular channel to the plurality of second openings; and
 a heater disposed in the dielectric body.

2. The electrostatic chuck of claim 1, wherein each of the plurality of radial channels extend between adjacent second channels.

3. The electrostatic chuck of claim 2, wherein the plurality of second openings includes eight second openings arranged equidistant from the first opening and at regular intervals along the peripheral region.

4. The electrostatic chuck of claim 3, wherein the plurality of radial channels includes four radial channels.

5. The electrostatic chuck of claim 1, wherein a length of the plurality of second channels from the annular channel to the plurality of second openings is greater than 120.0 mils.

6. The electrostatic chuck of claim 1, wherein the plurality of protrusions define a substrate receiving surface and recesses between the protrusions, wherein the recesses are configured to flow gas across the dielectric body while a substrate is disposed on the plurality of protrusions.

7. The electrostatic chuck of claim 6, wherein the plurality of protrusions include a first set of protrusions disposed in the central region of the electrostatic chuck have a greater surface area than a second set of protrusions disposed in the peripheral region of the electrostatic chuck.

8. The electrostatic chuck of claim 1, wherein the dielectric body includes an opening to accommodate a thermocouple.

9. The electrostatic chuck of claim 1, wherein the heater comprises an inner heater having a resistive heating element disposed in the central region and an outer heater having a resistive heating element disposed in the peripheral region.

10. A substrate support, comprising:
 a hollow shaft; and
 a pedestal, the pedestal comprising:
  a housing coupled to the hollow shaft;
  a dielectric body covering an electrode, the dielectric body coupled to the housing and including an upper surface having a first opening in a central region of the dielectric body and a plurality of second openings in a peripheral region of the dielectric body and a lower surface having a central opening,
  a plenum including a first channel that extends from the central opening to the first opening, a plurality of radial channels that extend from the first channel to an annular channel disposed in the peripheral region, and a plurality of second channels that extend from the annular channel to the plurality of second openings, wherein a length of the plurality of second channels from the annular channel to the plurality of second openings is greater than 120.0 mils; and
  one or more heating elements disposed in the dielectric body.

11. The substrate support of claim 10, wherein the pedestal includes one or more through holes to accommodate lift pins.

12. The substrate support of claim 10, wherein the pedestal further comprises a cooling plate coupled to a base of the pedestal.

13. The substrate support of claim 10, wherein the one or more heating elements comprise a first resistive heating element disposed in the central region and a second resistive heating element disposed in the peripheral region.

14. The substrate support of claim 10, wherein the plurality of second openings includes eight second openings arranged at regular intervals along the peripheral region of the dielectric body.

15. A physical vapor deposition (PVD) process chamber, comprising:
a chamber body;
a substrate support disposed within the chamber body and having a pedestal coupled to a hollow shaft, the pedestal having a dielectric body covering an electrode, the dielectric body including an upper surface and a lower surface, the upper surface configured to receive a substrate and the upper surface having a first opening in a central region of the dielectric body and a plurality of second openings in a peripheral region of the dielectric body and the lower surface having a central opening, wherein a diameter of each of the plurality of second openings is greater than 25.0 mils;
a heater disposed in the dielectric body;
a gas conduit extending from a gas supply disposed outside of the chamber body to the central opening; and
gas distribution channels extending from the central opening to the plurality of second openings, the gas distribution channels in fluid communication with the gas conduit, wherein at least one of:
the gas distribution channels include a first channel that extends from the central opening to the first opening, a plurality of radial channels that extend from the first channel to an annular channel disposed in the peripheral region, and a plurality of second channels that extend from the annular channel to the plurality of second openings;
the heater comprises a first resistive heating element disposed in the central region and a second resistive heating element disposed in the peripheral region; or
the plurality of second openings includes eight second openings arranged at regular intervals along the peripheral region of the dielectric body.

16. The PVD process chamber of claim 15, further comprising a lift mechanism that is capable of moving one or more lift pin through corresponding through holes in the dielectric body.

17. The PVD process chamber of claim 15, wherein the gas supply includes Argon (Ar) gas.

* * * * *